(12) United States Patent
Maruyama

(10) Patent No.: US 11,009,629 B2
(45) Date of Patent: May 18, 2021

(54) ANTI-REFLECTION FILM AND DEEP ULTRAVIOLET LIGHT-EMITTING DEVICE

(71) Applicant: DOWA Electronics Materials Co., Ltd., Tokyo (JP)

(72) Inventor: Tsukasa Maruyama, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 39 days.

(21) Appl. No.: 16/474,093

(22) PCT Filed: Dec. 22, 2017

(86) PCT No.: PCT/JP2017/046217
§ 371 (c)(1),
(2) Date: Jun. 27, 2019

(87) PCT Pub. No.: WO2018/123898
PCT Pub. Date: Jul. 5, 2018

(65) Prior Publication Data
US 2020/0124770 A1 Apr. 23, 2020

(30) Foreign Application Priority Data
Dec. 28, 2016 (JP) .............................. JP2016-256148

(51) Int. Cl.
G02B 1/115 (2015.01)
H01L 33/48 (2010.01)
H01L 33/58 (2010.01)

(52) U.S. Cl.
CPC ............ *G02B 1/115* (2013.01); *H01L 33/486* (2013.01); *H01L 33/58* (2013.01)

(58) Field of Classification Search
CPC ........ G02B 1/115; H01L 33/486; H01L 33/58
See application file for complete search history.

(56) References Cited

FOREIGN PATENT DOCUMENTS

| JP | H07244202 A | 9/1995 |
|---|---|---|
| JP | H10268106 A | 10/1998 |
| JP | H11264902 A | 9/1999 |
| JP | 2001013304 A | 1/2001 |

(Continued)

OTHER PUBLICATIONS

Machine Translation of JP-11264902, Sep. 28, 1999 (Year: 1999).*

(Continued)

*Primary Examiner* — Lex H Malsawma
(74) *Attorney, Agent, or Firm* — Kenja IP Law PC

(57) ABSTRACT

Provided is an anti-reflection film having low reflectance even for oblique incidence, which film is highly moisture resistant and is suitable for use in a deep ultraviolet light-emitting device. The anti-reflection film includes: a first layer having a first refractive index, provided on the window member; a second layer having a second refractive index; and a third layer having a third refractive index. For light having a wavelength of 280 nm, the first refractive index is 1.6 or more and 2.0 or less, the second refractive index is 2.0 or more and 2.7 or less and is higher than the first refractive index, the third refractive index is 1.3 or more and 1.6 or less and is lower than the first refractive index, and materials of the layers having the first refractive index, the second refractive index, and the third refractive index are made of oxides different from each other.

15 Claims, 9 Drawing Sheets

(56) References Cited

FOREIGN PATENT DOCUMENTS

| JP | 2002250801 A | 9/2002 |
| JP | 2002311209 A | 10/2002 |
| JP | 2012244170 A | 12/2012 |
| JP | 5968674 B2 | 8/2016 |

OTHER PUBLICATIONS

Jul. 2, 2019, International Preliminary Report on Patentability issued in the International Patent Application No. PCT/JP2017/046217.
Apr. 3, 2018, International Search Report issued in the International Patent Application No. PCT/JP2017/046217.
Mar. 20, 2018, Notice of Reasons for Refusal issued by the Japan Patent Office in the corresponding Japanese Patent Application No. 2016-256148.
Oct. 16, 2018, Decision of Refusal issued by the Japan Patent Office in the corresponding Japanese Patent Application No. 2016-256148.
Jun. 3, 2020, Office Action issued by the China National Intellectual Property Administration in the corresponding Chinese Patent Application No. 201780081401.6.

* cited by examiner

ANTI-REFLECTION FILM AND DEEP ULTRAVIOLET LIGHT-EMITTING DEVICE

TECHNICAL FIELD

This disclosure relates to an anti-reflection film and a deep ultraviolet light-emitting device including the anti-reflection film.

BACKGROUND

Light having wavelengths of 200 nm to 350 nm is called deep ultraviolet light, and in particular, deep ultraviolet light having wavelengths of 260 nm to 340 nm finds use in various applications such as curing of photosensitive resin; sensing such as detection of substance or compositional analysis; and disinfection and sterilization of water or a material surface. Known light-emitting devices emitting such deep ultraviolet light include deep ultraviolet light-emitting devices (DUV-LEDs).

Here, for example in blue light-emitting devices which emit light with wavelengths in the visible range, blue LED chips are usually sealed by covering the chips with a resin material such as a silicone resin (silicone) or an epoxy resin. However, since deep ultraviolet light cuts polymer chains forming a resin, when a deep ultraviolet LED chip is covered and sealed, the resin material would be deteriorated.

To address this, in a deep ultraviolet light-emitting device, a deep ultraviolet LED chip 1 is sealed using a ceramic carrier C as an enclosure, which is hollow inside, and a window member W made of for example transparent quartz, for example as in a surface mount device (SMD) structure depicted in FIG. 1. In order to prevent corrosion of the deep ultraviolet LED chip 1, the hollow space in the enclosure of FIG. 1 is filled with an inert gas such as nitrogen or the like. Further, in FIG. 1, electrodes E1 and E2 are electrically connected to the deep ultraviolet LED chip 1. A deep ultraviolet light-emitting device having such a hollow structure is disclosed for example in JP 2012-244170 A (PTL 1).

CITATION LIST

Patent Literature

PTL 1: JP 2012-244170 A
PTL 2: JP H10-268106 A

SUMMARY

Technical Problem

Here, deep ultraviolet light emitted from the deep ultraviolet LED chip 1 penetrates the window member W through the hollow space in the disclosure and further travels into the air. In this situation, when the deep ultraviolet light passes through the window member W, a certain ratio of the light is reflected at the interface of the window member W due to the difference between the refractive index of the window member W and the refractive index of the air. Specifically, as schematically illustrated in FIG. 2A and FIG. 2B, when deep ultraviolet light L enters the window member W, reflected light $R_1$ is produced at the interface of the window member W on the deep ultraviolet LED chip side, and when the deep ultraviolet light L penetrates to the air through the window member W, re-reflected light $R_2$ is also produced at the interface of the window member W on the air side. Note that refraction of incident light is not shown in FIG. 2B for brevity, and the same applies to FIG. 3B to be described below.

The transmittance for the deep ultraviolet light L in the case where the wavelength λ of the deep ultraviolet light L is 280 nm and the window member W is made of quartz (refractive index: 1.49) is specifically described. As illustrated in FIG. 2A, when the deep ultraviolet light L is normally incident on the window member W, the reflectance for both the incidence and the transmission is approximately 4%, thus the final transmittance is approximately 92%. Further, for the luminous intensity distribution of light from the deep ultraviolet LED chip 1, the half-power angle ($2\theta_{1/2}$) is typically around 120° to 150°; therefore, the reflectance in the case where the deep ultraviolet light L is obliquely incident on the window member W at an angle must also be considered. When the deep ultraviolet light L is incident on the window member W at an angle of 45° as illustrated in FIG. 2B, the reflectance for either the incidence or the transmission is approximately 9%, thus the final transmittance is approximately 82%.

In general, it is not easy to obtain high light output power from deep ultraviolet LED chips, and various attempts have been made to improve the light output power of deep ultraviolet LED chips. The inventor of this disclosure focused on the loss caused by the reflection of ultraviolet light described above in order to increase the final light output power of a deep ultraviolet light-emitting device, and contemplated providing an anti-reflection film $F_1$ and/or an anti-reflection film $F_2$ on the surfaces of incidence and transmission of the deep ultraviolet light L through the window member W as illustrated in FIG. 3A and FIG. 3B. When the loss in the case where the deep ultraviolet light L is obliquely incident on the window member W at an angle of 45° can be reduced to, for example, 1% each, the final transmittance is 98%, which is expected to significantly increase the light output power of the deep ultraviolet light-emitting device as compared with that of conventional deep ultraviolet light-emitting devices.

Anti-reflection films each made up of low-refractive-index films and high refractive index films that are alternately stacked are conventionally known. As an anti-reflection film for deep ultraviolet radiation, for example, multilayer antireflection coatings used in a light exposure system (stepper) are disclosed in JP H10-268106 A (PTL 2). The material of high-refractive-index layers used in PTL 2 is a fluoride such as lanthanum fluoride ($LaF_3$), and the material of low-refractive-index layers is also a fluoride such as magnesium fluoride ($MgF_2$) or cryolite ($Na_3AlF_6$). Note that the layer opposite to the incident medium is one of the low-refractive-index layers and forms a surface that is in contact with the outside, that is, gas such as the air in PTL 2.

Fluorides such as magnesium fluoride ($MgF_2$) or cryolite ($Na_3AlF_6$) are known to be hygroscopic; however, in an exposure system, the lens barrel is for example filled with an inert gas such as nitrogen, so that the hygroscopicity of those fluorides hardly matters. On the other hand, a deep ultraviolet light-emitting device may be exposed to the air containing moisture or may be placed in a hot and humid environment depending on use, thus the moisture resistance (environmental resistance) of an anti-reflection film in the device is essential. Therefore, anti-reflection films disclosed for example in PTL 2 cannot be applied to deep ultraviolet light-emitting devices as they are. Further, as described above, in the light of the luminous intensity distribution of light from deep ultraviolet LED chips, the loss caused due to oblique incidence must also be considered. Note that since the luminous intensity distribution of laser used in an exposure system (stepper) is significantly narrow, and anti-reflection films tailored for an exposure system (stepper) for example in PTL 2 cannot be applied to deep ultraviolet light-emitting devices with wide luminous intensity distribution.

It could therefore be helpful to provide an anti-reflection film which is highly moisture resistant and is suitable for use in a deep ultraviolet light-emitting device having low reflectance even for oblique incidence of deep ultraviolet light.

Solution to Problem

The inventor of this disclosure has intensively studied ways to solve the above problems. He thus found that an anti-reflection film having low reflectance even for oblique incidence, which film is highly moisture resistant and is suitable for use in a deep ultraviolet light-emitting device, can be obtained by providing layers made of highly moisture resistant oxides in an appropriate order, and have made the products disclosed herein.

Specifically, we propose the following features.

(1) An anti-reflection film which is provided on a light-transmitting window member, and prevents reflection of deep ultraviolet light having a center emission wavelength $\lambda$ in a range of 260 nm or more and 340 nm or less, comprising:

a first layer having a first refractive index, provided on the window member;

a second layer having a second refractive index, provided on the first layer; and a third layer having a third refractive index, provided on the second layer, wherein for light having a wavelength of 280 nm,
the first refractive index is 1.6 or more and 2.0 or less,
the second refractive index is 2.0 or more and 2.7 or less and is higher than the first refractive index,
the third refractive index is 1.3 or more and 1.6 or less and is lower than the first refractive index, and
materials of the layers having the first refractive index, the second refractive index, and the third refractive index are made of oxides different from each other.

(2) The anti-reflection film according to (1) above,
wherein an optical thickness $nd_1$ of the first layer, an optical thickness $nd_2$ of the second layer, and an optical thickness $nd_3$ of the third layer satisfy, with respect to the center emission wavelength $\lambda$:

$0.24\lambda \leq nd_1 \leq 0.26\lambda$, $0.24\lambda \leq nd_2 \leq 0.26\lambda$, and $0.26\lambda \leq nd_3 \leq 0.28\lambda$.

(3) The anti-reflection film according to (1) or (2) above, further comprising:
a fourth layer having the second refractive index of 2.0 or more and 2.7 or less; and
a fifth layer having the first refractive index of 1.6 or more and 2.0 or less on the fourth layer,
wherein the fourth layer and the fifth layer are provided between the first layer and the second layer.

(4) The anti-reflection film according to (1) or (2) above, further comprising:
a fourth layer having the second refractive index of 2.0 or more and 2.7 or less; and
a fifth layer having the third refractive index of 1.3 or more and 1.6 or less on the fourth layer,
wherein the fourth layer and the fifth layer are provided between the window member and the first layer.

(5) The anti-reflection film according to (3) or (4) above that is dependent from (1) above,
wherein an optical thickness $nd_1$ of the first layer, an optical thickness $nd_2$ of the second layer, an optical thickness $nd_3$ of the third layer, an optical thickness $nd_4$ of the fourth layer, and an optical thickness $nd_5$ of the fifth layer satisfy, with respect to the center emission wavelength $\lambda$:

$0.24\lambda \leq nd_1 \leq 0.26\lambda$, $0.24\lambda \leq nd_2 \leq 0.26\lambda$, $0.24\lambda \leq nd_3 \leq 0.28\lambda$, $0.48\lambda \leq nd_4 \leq 0.52\lambda$, and $0.48\lambda \leq nd_5 \leq 0.52\lambda$.

Here, the anti-reflection film according to (3) above dependent on (1) above refers to the anti-reflection film according to (3) above which is dependent on (1) above but not dependent on (2) above. Similarly, the anti-reflection film according to (4) above dependent on (1) above refers to the anti-reflection film according to (4) above which is dependent on (1) above but not dependent on (2) above.

(6) The anti-reflection film according to any one of (1) to (5) above, wherein a material of the layer having the first refractive index is $Al_2O_3$, a material of the layers having the second refractive index is $HfO_2$, a material of the layer having the third refractive index is $SiO_2$.

(7) An anti-reflection film which is provided on a light-transmitting window member, and prevents reflection of deep ultraviolet light having a center emission wavelength $\lambda$ in a range of 260 nm or more and 340 nm or less, comprising:

a first layer having a second refractive index, provided on the window member;

a second layer having a first refractive index, provided on the first layer;

a third layer having a third refractive index, provided on the second layer;

a fourth layer having the second refractive index, provided on the third layer; and a fifth layer having the third refractive index, provided on the fourth layer, wherein for light having a wavelength of 280 nm,
the first refractive index is 1.6 or more and 2.0 or less,
the second refractive index is 2.0 or more and 2.7 or less and is higher than the first refractive index,
the third refractive index is 1.3 or more and 1.6 or less and is lower than the first refractive index, and
the materials of the layers having the first refractive index, the second refractive index, and the third refractive index are made of oxides different from each other.

(8) The anti-reflection film according to (7) above,
wherein an optical thickness $nd_1$ of the first layer, an optical thickness $nd_2$ of the second layer, an optical thickness $nd_3$ of the third layer, an optical thickness $nd_4$ of the fourth layer, and an optical thickness $nd_5$ of the fifth layer satisfy, with respect to the center emission wavelength $\lambda$:

$0.24\lambda \leq nd_1 \leq 0.26\lambda$, $0.24\lambda \leq nd_2 \leq 0.26\lambda$, $0.24\lambda \leq nd_3 \leq 0.26\lambda$, $0.24\lambda \leq nd_4 \leq 0.26\lambda$, and $0.24\lambda \leq nd_5 \leq 0.26\lambda$.

(9) The anti-reflection film according to (7) or (8) above, wherein a material of the layer having the first refractive index is $Al_2O_3$, a material of the layers having the second refractive index is $HfO_2$, a material of the layers having the third refractive index is $SiO_2$.

(10) An anti-reflection film which is provided on a light-transmitting window member, and prevents reflection of deep ultraviolet light having a center emission wavelength λ in a range of 260 nm or more and 340 nm or less, comprising:

a first layer having a first refractive index, provided on the window member;

a second layer having a second refractive index, provided on the first layer;

a third layer having a third refractive index, provided on the second layer;

a fourth layer having the first refractive index, provided on the third layer; and a fifth layer having the third refractive index, provided on the fourth layer, wherein for light having a wavelength of 280 nm, the first refractive index is 1.6 or more and 2.0 or less, the second refractive index is 2.0 or more and 2.7 or less and is higher than the first refractive index, the third refractive index is 1.3 or more and 1.6 or less and is lower than the first refractive index, and materials of the layers having the first refractive index, the second refractive index, and the third refractive index are made of oxides different from each other.

(11) The anti-reflection film according to (10) above, wherein an optical thickness $nd_1$ of the first layer, an optical thickness $nd_2$ of the second layer, an optical thickness $nd_3$ of the third layer, an optical thickness $nd_4$ of the fourth layer, and an optical thickness $nd_5$ of the fifth layer satisfy, with respect to the center emission wavelength λ:

$0.48\lambda \leq nd_1 \leq 0.52\lambda,$ $0.48\lambda \leq nd_2 \leq 0.52\lambda,$ $0.24\lambda \leq nd_3 \leq 0.26\lambda,$ $0.24\lambda \leq nd_4 \leq 0.26\lambda,$ and $0.24\lambda \leq nd_5 \leq 0.26\lambda.$

(12) The anti-reflection film according to (10) or (11) above, wherein a material of the layers having the first refractive index is $Al_2O_3$, a material of the layer having the second refractive index is $HfO_2$, a material of the layers having the third refractive index is $SiO_2$.

(13) An anti-reflection film which is provided on a light-transmitting window member, and prevents reflection of deep ultraviolet light having a center emission wavelength λ in a range of 260 nm or more and 340 nm or less, comprising:

a first layer having a second refractive index, provided on the window member;

a second layer having a third refractive index, provided on the first layer;

a third layer having the second refractive index, provided on the second layer; and a fourth layer having the third refractive index, provided on the third layer, wherein for light having a wavelength of 280 nm, the second refractive index is 2.0 or more and 2.7 or less, the third refractive index is 1.3 or more and 1.6 or less, and materials of the layers having the second refractive index and the third refractive index are made of oxides different from each other.

(14) The anti-reflection film according to (13) above, wherein an optical thickness $nd_1$ of the first layer, an optical thickness $nd_2$ of the second layer, an optical thickness $nd_3$ of the third layer, and an optical thickness $nd_4$ of the fourth layer satisfy, with respect to the center emission wavelength λ:

$0.48\lambda \leq nd_1 \leq 0.52\lambda,$ $0.34\lambda \leq nd_2 \leq 0.38\lambda,$ $0.05\lambda \leq nd_3 \leq 0.15\lambda,$ and $0.30\lambda \leq nd_4 \leq 0.34\lambda.$

(15) The anti-reflection film according to (13) above, wherein a material of the layers having the second refractive index is $HfO_2$ and a material of the layers having the third refractive index is $SiO_2$, and an optical thickness $nd_1$ of the first layer, an optical thickness $nd_2$ of the second layer, an optical thickness $nd_3$ of the third layer, and an optical thickness $nd_4$ of the fourth layer satisfy, with respect to the center emission wavelength λ:

$0.48\lambda \leq nd_1 \leq 0.52\lambda,$ $0.35\lambda \leq nd_2 \leq 0.37\lambda,$ $0.05\lambda \leq nd_3 \leq 0.15\lambda,$ and $0.30\lambda \leq nd_4 \leq 0.34\lambda.$

(16) A deep ultraviolet light-emitting device comprising:

a deep ultraviolet LED chip emitting light having a center emission wavelength λ in a range of 260 nm or more and 340 nm or less; and a window member provided on a light extraction side of the deep ultraviolet LED chip, wherein the anti-reflection film according to any one of (1) to (15) above is provided at least on a side of the window member, opposite to the deep ultraviolet LED chip.

Advantageous Effect

This disclosure can provide an anti-reflection film having low reflectance even for oblique incidence, which film is highly moisture resistant and is suitable for use in a deep ultraviolet light-emitting device.

DETAILED DESCRIPTION

Figure 1:
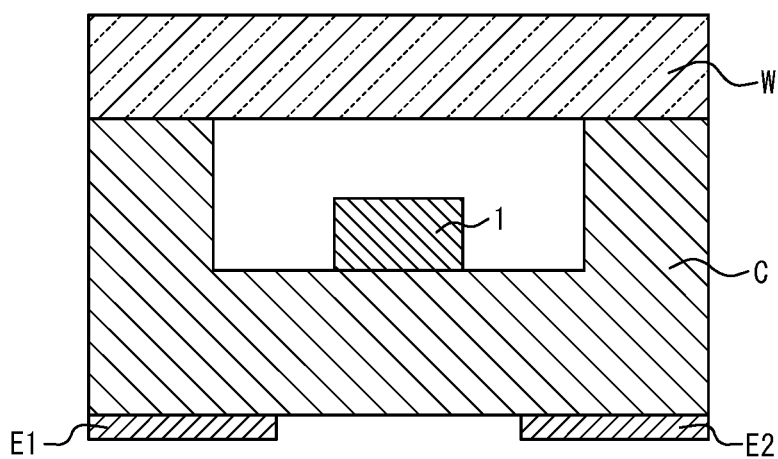
FIG. 1 is a schematic view illustrating a deep ultraviolet light-emitting device having a typical hollow structure.
Figure 2A:
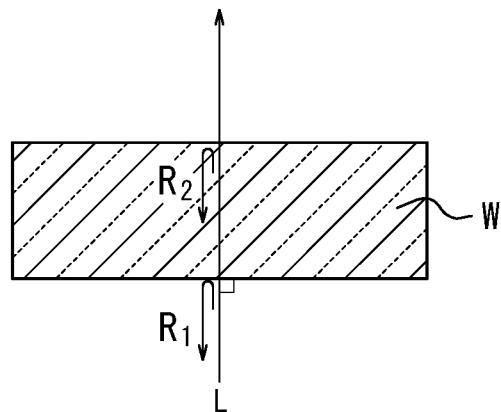
FIG. 2A is a schematic view illustrating the reflection of deep ultraviolet light passing through a light-transmitting window, and depicts the reflection for normal incidence.
Figure 2B:
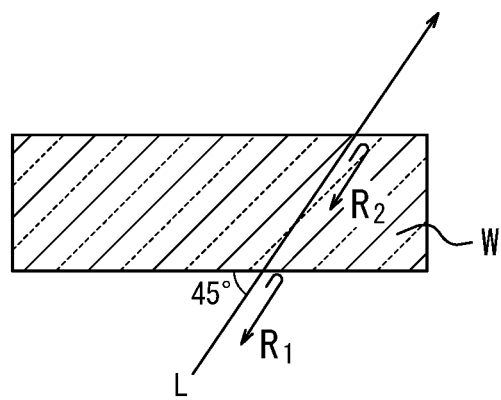
FIG. 2B is a schematic view illustrating the reflection of deep ultraviolet light passing through a light-transmitting window, and depicts the reflection for oblique incidence.
Figure 3A:
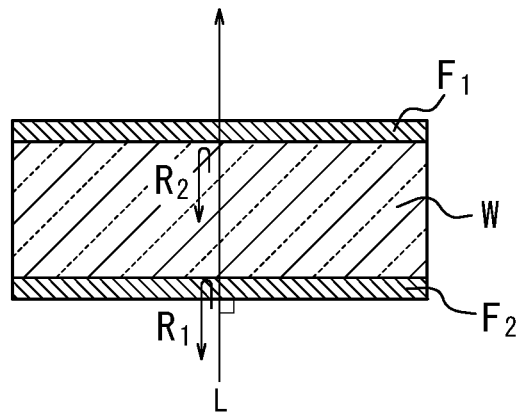
FIG. 3A is a schematic view illustrating the reflection of deep ultraviolet light passing through a light-transmitting window, and depicts the reflection for normal incidence.
Figure 3B:
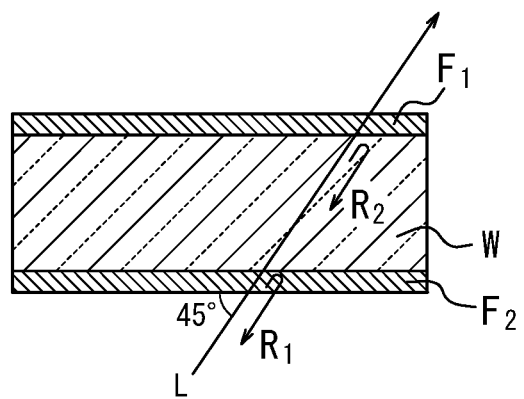
FIG. 3B is a schematic view illustrating the reflection of deep ultraviolet light passing through a light-transmitting window, and depicts the reflection for oblique incidence.

Embodiments of this disclosure will now be described with reference to the drawings. In principle, like components are denoted by like reference numerals, and the description of those components will not be repeated. A window member and layers in each diagram are exaggerated in thickness for convenience of description, so that the ratio between the vertical and horizontal dimensions of each illustrated component does not conform to the actual ratio. The values of first to third refractive indices are hereinafter expressed as refractive indices for a wavelength of 280 nm; however, since the values of refractive indices for 260 nm or more and 340 nm or less do not significantly vary, those skilled in the art readily appreciate that anti-reflection films according to this disclosure can be applied to deep ultraviolet light having a center emission wavelength in a range of 260 nm or more and 340 nm or less based on the description of the claims.

First Embodiment: Anti-Reflection Film 10

Figure 4:
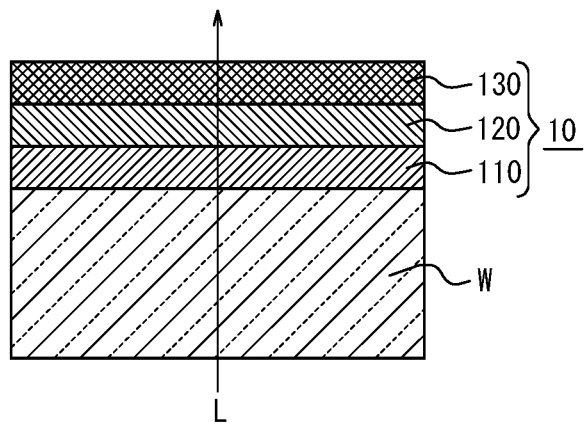
FIG. 4 is a schematic view illustrating an anti-reflection film according to a first embodiment of this disclosure.

As illustrated in FIG. 4, an anti-reflection film 10 of the first embodiment is provided on a light-transmitting window member W, and prevents reflection of deep ultraviolet light having a center emission wavelength λ in a range of 260 nm or more and 340 nm or less. Here, the anti-reflection film 10 includes a first layer 110 having a first refractive index, provided on the window member W; a second layer 120 having a second refractive index on the first layer 110; and a third layer 130 having a third refractive index on the second layer 120. For light having a wavelength of 280 nm, the first refractive index is 1.6 or more and 2.0 or less; the second refractive index is 2.0 or more and 2.7 or less and is higher than the first refractive index; and the third refractive index is 1.3 or more and 1.6 or less and is lower than the first refractive index. Further, the materials of the layers having the first refractive index, the second refractive index, and the third refractive index are made of oxides different from each other. In the anti-reflection film 10, the third layer 130 forms a surface upon which light toward the window member W is incident or a surface from which the light from the window member W is emitted. Since the layers 110, 120, and 130 in the anti-reflection film 10 are made of oxides, the anti-reflection film 10 is highly moisture resistant. Further, the layers 110, 120, and 130 meet the above conditions of refractive indices, thus the reflectance of the anti-reflection film 10 is low even for oblique incidence of deep ultraviolet light. These features will be sequentially described in detail below.

<Window Member>

The window member W transmits deep ultraviolet light having a center emission wavelength λ in a range of 260 nm or more and 340 nm or less. Note that "light-transmitting" herein means that the transmittance for light having a wavelength of 260 nm or more and 340 nm or less is 80% or more. The anti-reflection film of this disclosure is suitably used for a window member W having a refractive index of 1.40 or more and 1.80 or less with respect to the center emission wavelength λ. Further, the window member W is preferably highly moisture resistant, preferably has a solubility of $9.80 \times 10^{-5}$ [g/100 g—$H_2O$] or less in 20° C. water, and is particularly preferably insoluble in room temperature water. Specific examples of such a window member W include quartz (quartz single crystals; refractive index: 1.49), fused quartz (fused silica; refractive index: 1.49), and sapphire ($Al_2O_3$; refractive index: 1.71).

<First Layer 110>

The first layer 110 is provided on the window member W and has the first refractive index, and the first refractive index is 1.6 or more and 2.0 or less, more preferably 1.6 or more and 1.8 or less with respect to a wavelength of 280 nm. Aluminum oxide ($Al_2O_3$) is particularly preferably used as a material of the layer which is highly moisture resistant and has the first refractive index falling within the above refractive index range; alternatively, magnesium oxide (MgO) or the like may be used, or a mixture containing 90% by mass or more of aluminum oxide ($Al_2O_3$) may be used. Note that such a mixture satisfies the above conditions of refractive indices.

<Second Layer 120>

The second layer 120 is provided on the first layer 110 and has the second refractive index, and the second refractive index is 2.0 or more and 2.7 or less, more preferably 2.0 or more and 2.5 or less with respect to a wavelength of 280 nm. Hafnium oxide ($HfO_2$) is particularly preferably used as a material of the layer which is highly moisture resistant and has the second refractive index falling within the above refractive index range; alternatively, scandium(III) oxide ($Sc_2O_3$) or the like may be used, or a mixture containing 90% by mass or more of hafnium oxide ($HfO_2$) may be used. Note that such a mixture satisfies the above conditions of refractive indices.

<Third Layer 130>

The third layer 130 is provided on the second layer 120 and has the third refractive index, and the third refractive index is 1.3 or more and 1.6 or less, more preferably 1.4 or more and 1.5 or less with respect to a wavelength of 280 nm. Silicon dioxide ($SiO_2$) is particularly preferably used as a material of the layer which is highly moisture resistant and has the third refractive index falling within the above refractive index range. Note that as long as the above conditions of refractive indices are satisfied, the material of the layer having the third refractive index may contain some impurities in addition to silicon dioxide.

<Optical Thickness>

Here, in order to reduce the reflectance for deep ultraviolet light more reliably, the optical thickness $nd_1$ of the first layer 110, the optical thickness $nd_2$ of the second layer 120, and the optical thickness $nd_3$ of the third layer 130 preferably satisfy the following conditions, with respect to the center emission wavelength $\lambda$:

$$0.24\lambda \leq nd_1 \leq 0.26\lambda,$$

$$0.24\lambda \leq nd_2 \leq 0.26\lambda, \text{ and}$$

$$0.26\lambda \leq nd_3 \leq 0.28\lambda.$$

Note that the optical thickness nd means the product of the refractive index (n) and the physical film thickness (d) of each layer (n×d).

Here, the above layers 110, 120, and 130 can be sequentially formed by a typical method, for example by PVD such as vacuum vapor deposition, RF sputtering, or ion plating. Alternatively, the layers may be formed by CVD. In terms of manufacturing costs and processing accuracy, vacuum vapor deposition is preferably used. For vacuum vapor deposition, either electron-beam vacuum deposition or resistance heating vapor deposition can be used. Further, each layer can be formed by a similar typical method also in the first variation, the second variation, a second embodiment, a third embodiment, and a fourth embodiment to be described below.

Here, the anti-reflection film of the first embodiment preferably has a three-layer structure including the first layer 110, the second layer 120, and the third layer 130 in terms of manufacturing costs and simplification of the structure of the anti-reflection film. However, as will be described in the first variation and the second variation below, the anti-reflection film may preferably further include fourth layers 141, 142 and fifth layers 151, 152.

(First Variation of First Embodiment: Anti-Reflection Film 11)

Figure 5:
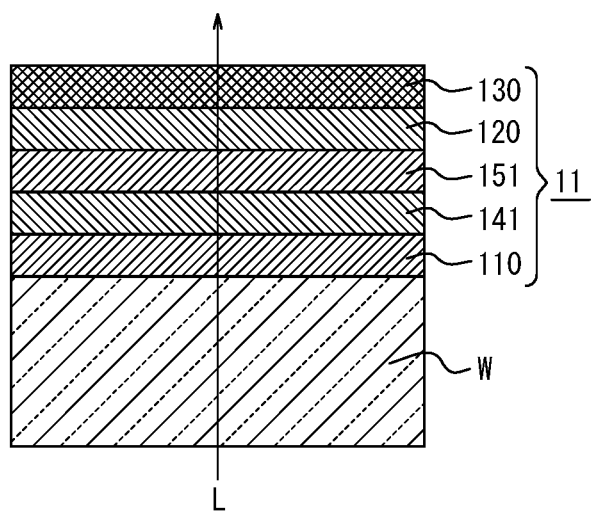
FIG. 5 is a schematic view illustrating an anti-reflection film according to a first variation of the first embodiment of this disclosure.

As illustrated in FIG. 5, an anti-reflection film 11 according to the first variation of the first embodiment corresponds to the anti-reflection film 10 described above that further includes a fourth layer 141 having a second refractive index of 2.0 or more and 2.7 or less and a fifth layer 151 having a first refractive index of 1.6 or more and 2.0 or less on the fourth layer 141. Further, the fourth layer 141 and the fifth layer 151 are provided between the first layer 110 and the second layer 120. Accordingly, in the anti-reflection film 11 of the first variation, the first layer 110, the fourth layer 141, the fifth layer 151, the second layer 120, and the third layer 130 are provided in this order from the window member W side; and the third layer 130 forms a surface upon which light toward the window member W is incident or a surface from which light from the window member W is emitted.

<Fourth Layer 141>

The fourth layer 141 may be made of the same material as the second layer 120 or may be made of a different material as long as the conditions of the second refractive index with respect to a wavelength of 280 nm as described above for the second layer 120 of the first embodiment are satisfied. However, in terms of manufacturing costs and simplification of the structure of the anti-reflection film, the fourth layer 141 and the second layer 120 are preferably made of the same material, and the material is preferably hafnium oxide.

<Fifth Layer 151>

Similarly, the fifth layer 151 may be made of the same material as the first layer 110 or may be made of a different material as long as the conditions of the first refractive index with respect to a wavelength of 280 nm as described above for the first layer 110 of the first embodiment are satisfied. However, in terms of manufacturing costs and simplification of the structure of the anti-reflection film, the fifth layer 151 and the first layer 110 are preferably made of the same material, and the material is preferably aluminum oxide.

<Optical Thickness>

Further, in order to reduce reflectance more reliably, the optical thickness $nd_1$ of the first layer 110, the optical thickness $nd_2$ of the second layer 120, the optical thickness $nd_3$ of the third layer 130, the optical thickness $nd_4$ of the fourth layer 141, and the optical thickness $nd_5$ of the fifth layer 151 preferably satisfy the following conditions, with respect to the center emission wavelength $\lambda$:

$$0.24\lambda \leq nd_1 \leq 0.26\lambda,$$

$$0.24\lambda \leq nd_2 \leq 0.26\lambda,$$

$$0.24\lambda \leq nd_3 \leq 0.28\lambda,$$

$$0.48\lambda \leq nd_4 \leq 0.52\lambda, \text{ and}$$

$$0.48\lambda \leq nd_5 \leq 0.52\lambda.$$

Accordingly, in the first variation, the optical thickness of the layers preferably satisfies:

$$0.24\lambda \leq nd_1 \leq 0.26\lambda,$$

$$0.48\lambda \leq nd_4 \leq 0.52\lambda,$$

$$0.48\lambda \leq nd_5 \leq 0.52\lambda,$$

$$0.24\lambda \leq nd_2 \leq 0.26\lambda, \text{ and}$$

$$0.24\lambda \leq nd_3 \leq 0.28\lambda,$$

in this order from the window member W side.

Further, in order to reduce reflectance and to simplify the structure of the anti-reflection film, the anti-reflection film 11 is preferably configured to have the five-layer structure described above in the first variation.

(Second Variation of First Embodiment: Anti-Reflection Film 12)

Figure 6:
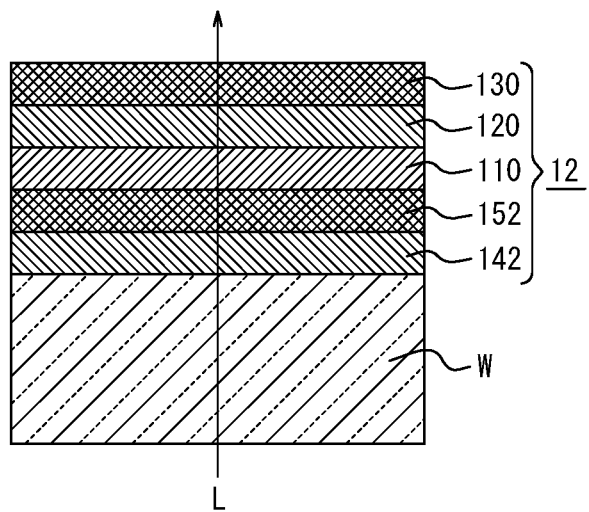
FIG. 6 is a schematic view illustrating an anti-reflection film according to a second variation of the first embodiment of this disclosure.

As illustrated in FIG. 6, an anti-reflection film 12 according to the second variation of the first embodiment corresponds to the anti-reflection film 10 described above that further includes a fourth layer 142 having a second refractive index of 2.0 or more and 2.7 or less and a fifth layer 152 having a third refractive index of 1.3 or more and 1.6 or less on the fourth layer 142. The fourth layer 142 and the fifth layer 152 are provided between the window member W and the first layer 110. Accordingly, in the anti-reflection film 12 of the second variation, the fourth layer 142, the fifth layer 152, the first layer 110, the second layer 120, and the third layer 130 are provided in this order from the window member W side; and the third layer 130 forms a surface upon which light toward the window member W is incident or a surface from which light from the window member W is emitted.

<Fourth Layer 142>

The fourth layer 142 may be made of the same material as the second layer 120 or may be made of a different material as long as the conditions of the second refractive index with respect to a wavelength of 280 nm as described above for the second layer 120 of the first embodiment are satisfied. However, in terms of manufacturing costs and simplification of the structure, the fourth layer 142 and the second layer 120 are preferably made of the same material, and the material is preferably hafnium oxide.

<Fifth Layer 152>

Similarly, the fifth layer 152 may be made of the same material as the third layer 130 of the first embodiment or may be made of a different material as long as the conditions of the third refractive index with respect to a wavelength of 280 nm as described above for the third layer 130 are satisfied. However, in terms of manufacturing costs and simplification of the structure, the fifth layer 152 and the third layer 130 are preferably made of the same material, and the material is preferably silicon dioxide.

<Optical Thickness>

Further, in order to reduce reflectance more reliably, the optical thickness $nd_1$ of the first layer 110, the optical thickness $nd_2$ of the second layer 120, the optical thickness $nd_3$ of the third layer 130, the optical thickness $nd_4$ of the fourth layer 142, and the optical thickness $nd_5$ of the fifth layer 152 preferably satisfy the following conditions, with respect to the center emission wavelength $\lambda$:

$$0.24\lambda \leq nd_1 \leq 0.26\lambda,$$

$$0.24\lambda \leq nd_2 \leq 0.26\lambda,$$

$$0.24\lambda \leq nd_3 \leq 0.28\lambda,$$

$$0.48\lambda \leq nd_4 \leq 0.52\lambda, \text{ and}$$

$$0.48\lambda \leq nd_5 \leq 0.52\lambda.$$

Accordingly, in the second variation, the optical thickness of the layers preferably satisfies:

$$0.48\lambda \leq nd_4 \leq 0.52\lambda,$$

$$0.48\lambda \leq nd_5 \leq 0.52\lambda,$$

$$0.24\lambda \leq nd_1 \leq 0.26\lambda,$$

$$0.24\lambda \leq nd_2 \leq 0.26\lambda, \text{ and}$$

$$0.24\lambda \leq nd_3 \leq 0.28\lambda,$$

in this order from the window member W side.

Further, in order to reduce reflectance and to simplify the structure of the anti-reflection film, the anti-reflection film 12 is preferably configured to have the five-layer structure described above in the second variation.

Next, second, third, and forth embodiments of anti-reflection films according to this disclosure are described. In these embodiments, the refractive indices of the layers are the same as those in the first embodiment, and the order and preferred optical thickness of the layers are different from those in the first embodiment. Description of the same refractive indices and the material of the layers having the refractive indices will not be repeated below.

Second Embodiment: Anti-Reflection Film 20

Figure 7:
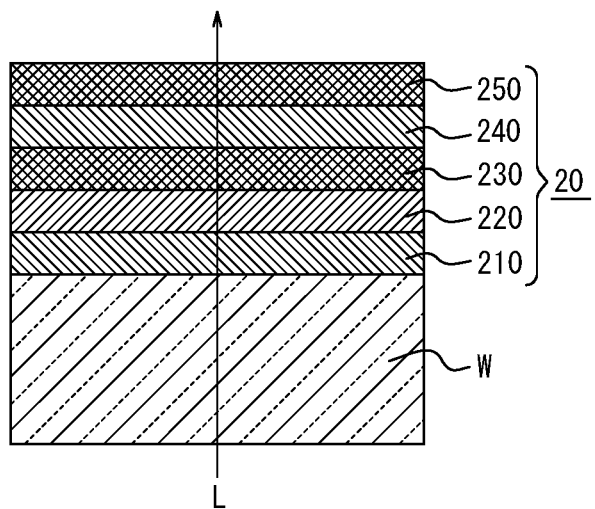
FIG. 7 is a schematic view illustrating an anti-reflection film according to a second embodiment of this disclosure.

As illustrated in FIG. 7, an anti-reflection film 20 of the second embodiment is provided on a light-transmitting window member W, and prevents reflection of deep ultraviolet light having a center emission wavelength $\lambda$ in a range of 260 nm or more and 340 nm or less. Here, the anti-reflection film 20 includes a first layer 210 having a second refractive index, provided on the window member W; a second layer 220 having a first refractive index on the first layer 210; a third layer 230 having a third refractive index on the second layer 220; a fourth layer 240 having the second refractive index on the third layer 230; and a fifth layer 250 having the third refractive index on the fourth layer 240. The first, second, and third refractive indices are the same as those in the first embodiment above. For light having a wavelength of 280 nm, the first refractive index is 1.6 or more and 2.0 or less; the second refractive index is 2.0 or more and 2.7 or less and is higher than the first refractive index; and the third refractive index is 1.3 or more and 1.6 or less and is lower than the first refractive index. Further, the materials of the layers having the first refractive index, the second refractive index, and the third refractive index are made of oxides different from each other. In the anti-reflection film 20, the fifth layer 250 forms a surface upon which light toward the window member W is incident or a surface from which the light from the window member W is emitted. Since the layers 210, 220, 230, 240, and 250 in the anti-reflection film 20 are made of oxides, the anti-reflection film 20 is highly moisture resistant. Further, the layers 210, 220, 230, 240, and 250 meet the above conditions of refractive indices, thus the reflectance of the anti-reflection film 20 is low even for oblique incidence of deep ultraviolet light.

<Optical Thickness>

Here, in order to reduce reflectance more reliably, the optical thickness $nd_1$ of the first layer 210, the optical thickness $nd_2$ of the second layer 220, the optical thickness $nd_3$ of the third layer 230, the optical thickness $nd_4$ of the fourth layer 240, and the optical thickness $nd_5$ of the fifth layer 250 preferably satisfy the following conditions, with respect to the center emission wavelength $\lambda$:

$$0.24\lambda \leq nd_1 \leq 0.26\lambda,$$

$$0.24\lambda \leq nd_2 \leq 0.26\lambda,$$

$$0.24\lambda \leq nd_3 \leq 0.26\lambda,$$

$$0.24\lambda \leq nd_4 \leq 0.26\lambda, \text{ and}$$

$$0.24\lambda \leq nd_5 \leq 0.26\lambda.$$

Further, in the second embodiment, the anti-reflection film 20 is preferably configured to have the five-layer structure described above.

Third Embodiment: Anti-Reflection Film 30

Figure 8:
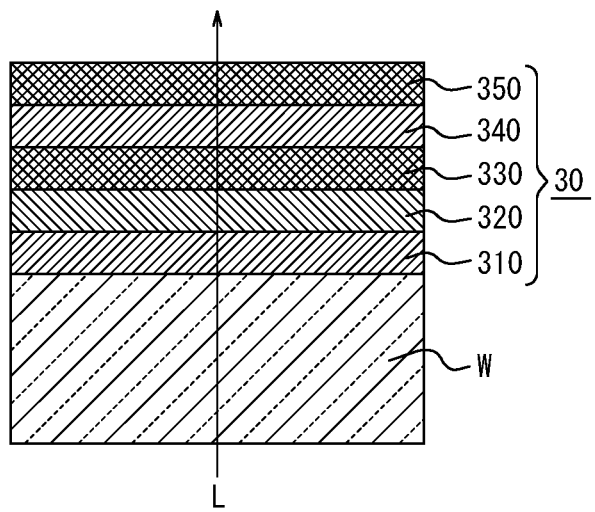
FIG. 8 is a schematic view illustrating an anti-reflection film according to a third embodiment of this disclosure.

As illustrated in FIG. 8, an anti-reflection film 30 of the third embodiment is provided on a light-transmitting window member W, and prevents reflection of deep ultraviolet light having a center emission wavelength $\lambda$ in a range of 260 nm or more and 340 nm or less. Here, the anti-reflection film 30 includes a first layer 310 having a first refractive index, provided on the window member W; a second layer 320 having a second refractive index on the first layer 310; a third layer 330 having a third refractive index on the second layer 320; a fourth layer 340 having the first refractive index on the third layer 330; and a fifth layer 350 having the third refractive index on the fourth layer 340. The first, second, and third refractive indices are the same as those in the first embodiment above. For light having a wavelength of 280 nm, the first refractive index is 1.6 or more and 2.0 or less; the second refractive index is 2.0 or more and 2.7 or less and is higher than the first refractive index; and the third refractive index is 1.3 or more and 1.6 or less and is lower than the first refractive index. Further, the materials of the layers having the first refractive index, the second refractive index, and the third refractive index are made of oxides different from each other. In the anti-reflection film 30, the fifth layer 350 forms a surface upon which light toward the window member W is incident or a surface from which the light from the window member W is emitted. Since the layers 310, 320, 330, 340, and 350 in the anti-reflection film 30 are made of oxides, the anti-reflection film 30 is highly moisture resistant. Further, the layers 310, 320, 330, 340, and 350 meet the above conditions of refractive indices, thus the reflectance of the anti-reflection film 30 is low even for oblique incidence of deep ultraviolet light.

<Optical Thickness>

Here, in order to reduce reflectance more reliably, the optical thickness $nd_1$ of the first layer 310, the optical thickness $nd_2$ of the second layer 320, the optical thickness $nd_3$ of the third layer 330, the optical thickness $nd_4$ of the fourth layer 340, and the optical thickness $nd_5$ of the fifth layer 350 preferably satisfy the following conditions, with respect to the center emission wavelength $\lambda$:

$0.48\lambda \le nd_1 \le 0.52\lambda$, $0.48\lambda \le nd_2 \le 0.52\lambda$, $0.24\lambda \le nd_3 \le 0.26\lambda$, $0.24\lambda \le nd_4 \le 0.26\lambda$, and $0.24\lambda \le nd_5 \le 0.26\lambda$.

Further, in the third embodiment, the anti-reflection film 30 is preferably configured to have the five-layer structure described above.

Fourth Embodiment: Anti-Reflection Film 40

Figure 9:
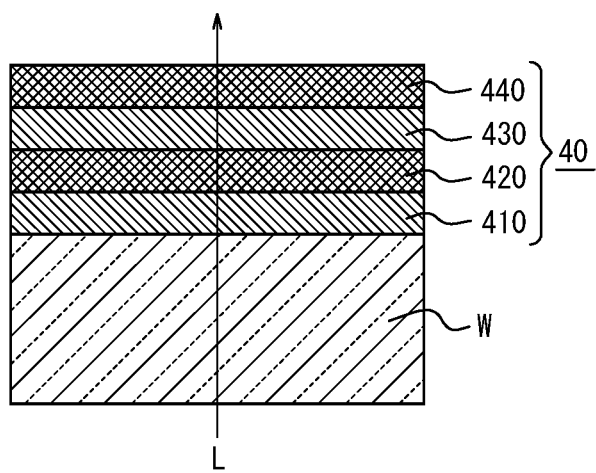
FIG. 9 is a schematic view illustrating an anti-reflection film according to a fourth embodiment of this disclosure.

As illustrated in FIG. 9, an anti-reflection film 40 of the fourth embodiment is provided on a light-transmitting window member W, and prevents reflection of deep ultraviolet light having a center emission wavelength $\lambda$ in a range of 260 nm or more and 340 nm or less. Here, the anti-reflection film 40 includes a first layer 410 having a second refractive index, provided on the window member W; a second layer 420 having a third refractive index on the first layer 410; a third layer 430 having the second refractive index on the second layer 420; and a fourth layer 440 having the third refractive index on the third layer 430. The second and third refractive indices are the same as those in the first embodiment above. For light having a wavelength of 280 nm, the second refractive index is 2.0 or more and 2.7 or less, and the third refractive index is 1.3 or more and 1.6 or less. Further, the materials of the layers having the second refractive index and the third refractive index are made of oxides different from each other. In the anti-reflection film 40, the fourth layer 440 forms a surface upon which light toward the window member W is incident or a surface from which the light from the window member W is emitted. Since the layers 410, 420, 430, and 440 in the anti-reflection film 40 are made of oxides, the anti-reflection film 40 is highly moisture resistant. Further, the layers 410, 420, 430, and 440 meet the above conditions of refractive indices, thus the reflectance of the anti-reflection film 40 is low even for oblique incidence of deep ultraviolet light.

<Optical Thickness>

Here, in order to reduce the reflectance for deep ultraviolet light more reliably, the optical thickness $nd_1$ of the first layer 410, the optical thickness $nd_2$ of the second layer 420, and the optical thickness $nd_3$ of the third layer 430, and the optical thickness $nd_4$ of the fourth layer 440 preferably satisfy the following conditions, with respect to the center emission wavelength $\lambda$:

$0.48\lambda \le nd_1 \le 0.52\lambda$, $0.34\lambda \le nd_2 \le 0.38\lambda$, $0.05\lambda \le nd_3 \le 0.15\lambda$, and $0.30\lambda \le nd_4 \le 0.34\lambda$.

It is particularly preferred that a material of the layers having the second refractive index is $HfO_2$, the material of the layers having the third refractive index is $SiO_2$, and the optical thicknesses $nd_1$, $nd_2$, nd3, and $nd_4$ satisfy the following conditions, with respect to the center emission wavelength $\lambda$:

$0.48\lambda \le nd_1 \le 0.52\lambda$, $0.35\lambda \le nd_2 \le 0.37\lambda$, $0.05\lambda \le nd_3 \le 0.15\lambda$, and $0.30\lambda \le nd_4 \le 0.34\lambda$.

Further, in the fourth embodiment, the anti-reflection film 40 is preferably configured to have the four-layer structure described above.

As will be described also in examples below, when the above-described anti-reflection films 10, 11, 12, 20, 30, and 40 are provided on the window member W, the reflectance of the interface between the window member W and the anti-reflection films for deep ultraviolet light having a center emission wavelength $\lambda$ in a range of 260 nm or more and 340 nm or less can be 1% or less in the case of normal incidence, and can be 2% or less in the case of 45° oblique incidence. Consequently, when the disclosed anti-reflection films are provided on both surfaces of the window member W, the transmission of deep ultraviolet light can be 99% or more in the case of normal incidence and can be 98% or more in the case of 45° oblique incidence.

Further, as described above, since the disclosed anti-reflection films are highly moisture resistant, they can be used while being exposed to the air containing moisture. Accordingly, the disclosed anti-reflection films can be suitably used in deep ultraviolet light-emitting devices. Further, the anti-reflection films are suitable for deep ultraviolet light having a center emission wavelength $\lambda$ in a range of 260 nm or more and 340 nm or less as described above; meanwhile, the anti-reflection films are of course also suitable for deep ultraviolet light having a center emission wavelength $\lambda$ in a range of 270 nm or more and 290 nm or less and deep ultraviolet light having a center emission wavelength $\lambda$ in a range of 300 nm or more and 320 nm or less.

Note that the optical constants such as the refractive index and the film thickness of each layer of the disclosed antireflection films can be measured using for example a commercially available reflection spectroscopic film thickness gauge.

Fifth Embodiment: Deep Ultraviolet Light-Emitting Device

Figure 10:
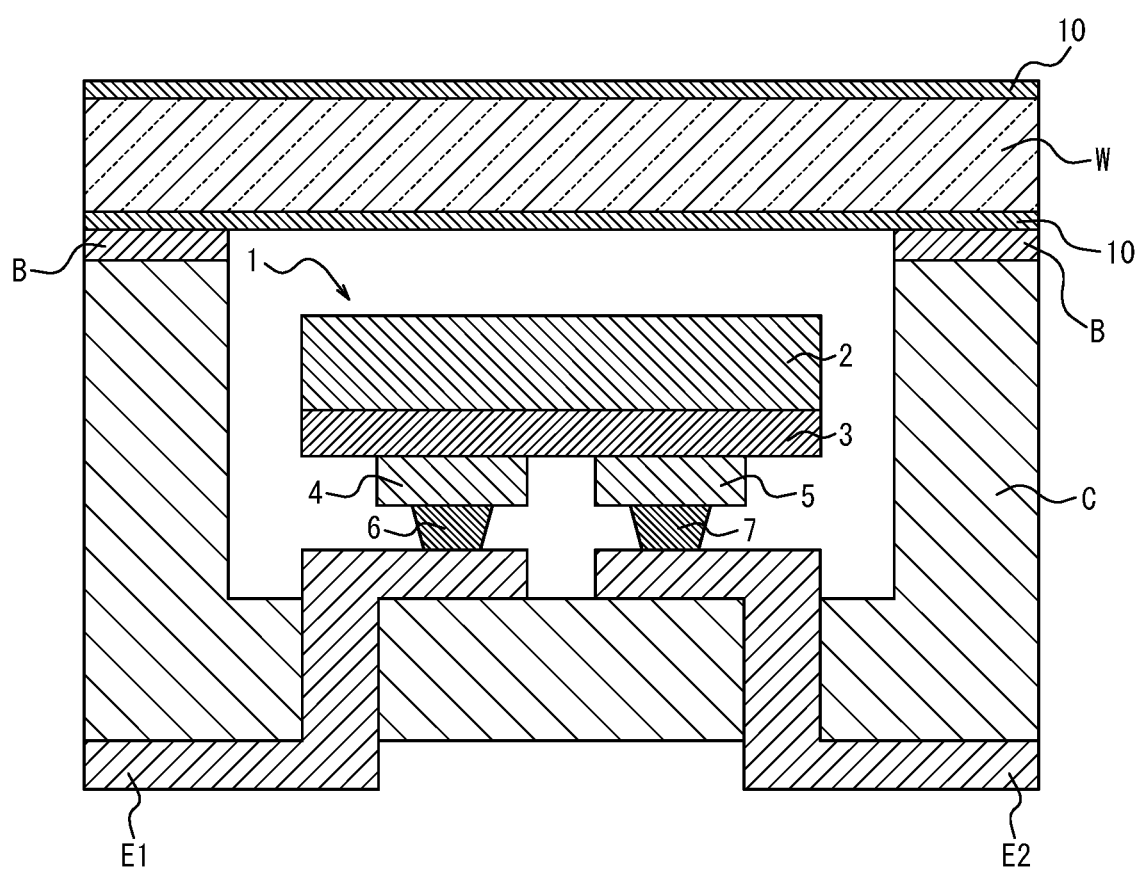
FIG. 10 is a schematic view of a deep ultraviolet light-emitting device including anti-reflection films according to the first embodiment of this disclosure.

A deep ultraviolet light-emitting device according to a fifth embodiment of this disclosure includes a deep ultraviolet LED chip 1 having a center emission wavelength in a range of 260 nm or more and 340 nm or less, and a light-transmitting window member W provided on the light extraction side of the deep ultraviolet LED chip 1 as schematically illustrated in FIG. 10. Further, the anti-reflection film 10 is provided at least on a surface of the window member W on the side opposite to the deep ultraviolet LED chip 1.

Note that in a deep ultraviolet light-emitting device, as illustrated in FIG. 10, the anti-reflection film 10 is preferably provided also on a surface of the window member W on the deep ultraviolet LED chip 1 side. Further, one of the anti-reflection films 11, 12, 20, 30, and 40 described above may be provided on both surfaces of the window member W instead of the anti-reflection film 10 depicted in FIG. 10. Anti-reflection films of the same type are preferably provided on the front and back surfaces of the window member W (for example, an anti-reflection film 10 on the front surface side and an anti-reflection film 10 on the back surface side) in manufacturing terms; however, anti-reflection films having different layer structures may be provided (for example, an anti-reflection film 10 on the front surface side and an anti-reflection film 11 on the back surface side).

The deep ultraviolet LED chip 1 used may be a typical one. For example, a semiconductor layer 3 made of a III nitride semiconductor such as AlGaN is epitaxially grown on a sapphire substrate 2; an n-type electrode 4 as an n-type layer and a p-type electrode 5 as a p-type layer are formed by vapor deposition or the like; and singulation is performed, thus the deep ultraviolet LED chip 1 can be obtained.

Gold stud bumps 6 and 7 are formed on electrodes 4 and 5 of the thus obtained deep ultraviolet LED chip 1, respectively using a wire bonder or the like, and the deep ultraviolet LED chip 1 with the gold stud bumps is then be mounted on a ceramic carrier C made of MN or the like. The mounting can be performed using, for example, ultrasonic welding. Note that as illustrated in FIG. 10, wiring electrodes E1 and E2 penetrating the carrier C are provided on the back surface of the carrier C. The carrier C on which the deep ultraviolet LED chip 1 is mounted is joined to the window member W on both surfaces of which are previously provided with the anti-reflection films 10 as described above, thus a deep ultraviolet light-emitting device can be obtained. In joining the window member W and the carrier C, various kinds of materials can be used as a bonding material B; for example, AuSn or the like may be used as the bonding material B for fused metallization; silver nanoparticles or the like may be used as the bonding material B for fusing; or a UV curable resin, an epoxy resin material, or the like may be used as the bonding material B.

The deep ultraviolet light-emitting device illustrated in FIG. 10 is provided with anti-reflection films which are highly moisture resistant and have low reflectance even for oblique incidence of deep ultraviolet light. Accordingly, the disclosed deep ultraviolet light-emitting device is highly moisture resistant and undergoes little loss of deep ultraviolet light penetrating the window member W, thus high light output is achieved.

Although the window member W illustrated in FIG. 10 has a shape of a flat plane, the shape of the window member W that can be applied to this disclosure is not limited to a flat plane and may be a curved spherical surface known as a so-called cannonball shape. Although FIG. 10 schematically illustrates an SMD structure, a deep ultraviolet light-emitting device in which an anti-reflection film according to any of the first to fourth embodiments described above is formed on the surface of a window member (lens) of a can package is of course included in this disclosure. Further, when the anti-reflection film 10 is formed on the surface of the window member W on the side opposite to the deep ultraviolet LED chip 1, it is preferred that the anti-reflection film is previously formed before the bonding with the carrier C; alternatively, the anti-reflection film may be formed on the surface opposite to the deep ultraviolet LED chip 1 after the bonding with the carrier C.

Example 1

The anti-reflection films and deep ultraviolet light-emitting devices according to this disclosure will be described in more detail below using examples. However, this disclosure is not limited to the following examples in any way.

Invention Example 1

An anti-reflection film of Invention Example 1 was formed on a window member as in Table 1 below in the manner in which the anti-reflection film 10 in the first embodiment is formed. The formation of each layer was performed by electron-beam vacuum vapor deposition. The film formation was performed to achieve a center emission wavelength λ of 280 nm and physical thicknesses meeting the optical thicknesses in Table 1 below by controlling the thicknesses. Further, a flat synthetic quartz plate was used as the window member.

TABLE 1

Invention Example 1 (Anti-reflection film 10)

| Layer No. *1 | Material | Refractive index | Optical thickness |
|---|---|---|---|
| Air | — | — | — |
| 3 (Third layer 130) | $SiO_2$ | 1.49 | $0.27 \times \lambda$ |
| 2 (Second layer 120) | $HfO_2$ | 2.08 | $0.25 \times \lambda$ |
| 1 (First layer 110) | $Al_2O_3$ | 1.71 | $0.25 \times \lambda$ |
| Window member | Synthetic quartz | 1.49 | — |
| Transmittance (Wavelength: 280 nm) | Normal incidence | 99.48% | |
| | 45° incidence | 98.75% | |

*1: The layers are numbered 1, 2, ... from the window member side. The features in Embodiments corresponding to the layers are parenthesized. These also apply to Tables below.

<Evaluation of Reflectance>

Figure 11A:
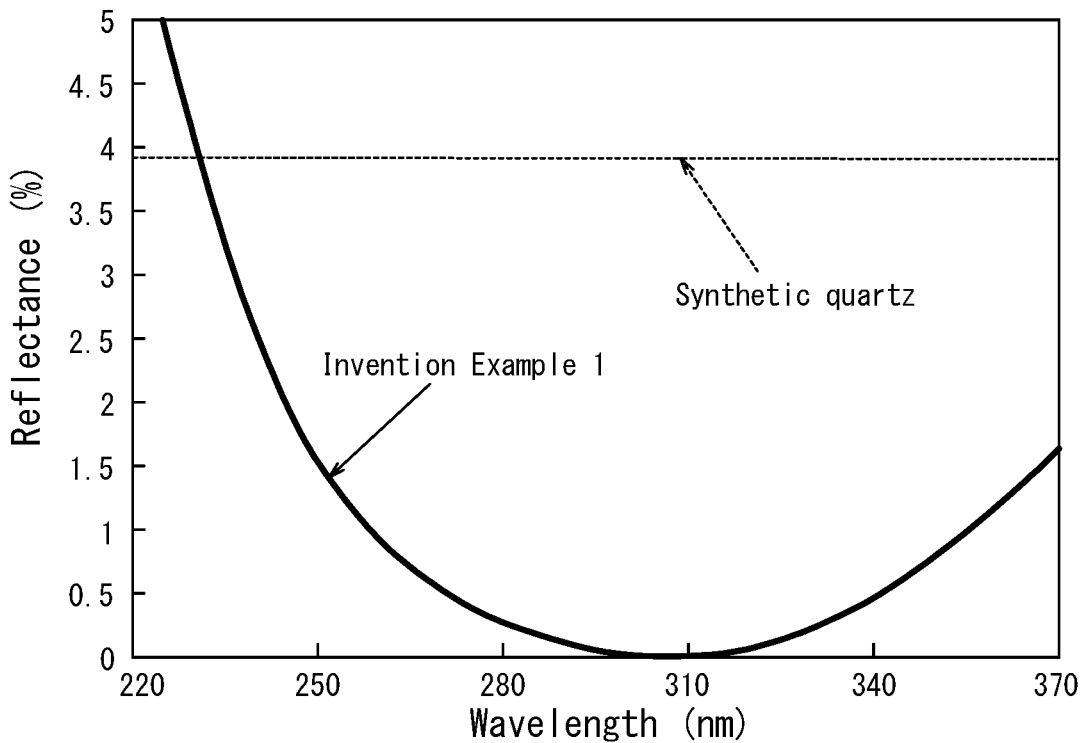
FIG. 11A is a graph illustrating the spectral reflectance in Invention Example 1, and depicts the spectral reflectance for normal incidence.
Figure 11B:
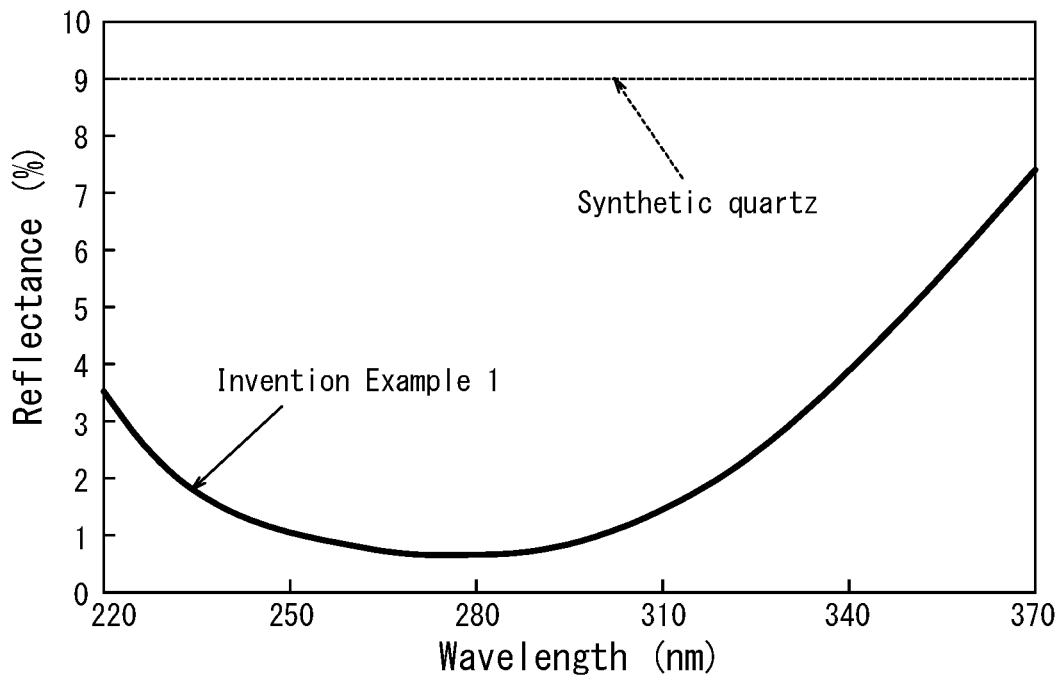
FIG. 11B is a graph illustrating the spectral reflectance in Invention Example 1, and depicts the spectral reflectance for 45° oblique incidence.

The spectral reflectance of Invention Example 1 are illustrated in the graphs of FIG. 11A and FIG. 11B. FIG. 11A illustrates the spectral reflectance in the case of normal incidence, and FIG. 11B illustrates the spectral reflectance in the case of 45° oblique incidence. Low reflectance was observed for deep ultraviolet light having a center emission wavelength λ in a range of 260 nm or more and 340 nm or less. FIG. 11A and FIG. 11B also illustrate the reflectance of synthetic quartz for reference. Further, the transmittance (%) with respect to deep ultraviolet light having a wavelength of 280 nm, which was calculated from the reflectance is also given in Table 1. The transmittance (%) found by the same manner is also given in Tables 2 to 9 below.

Invention Example 2-1

An anti-reflection film of Invention Example 2-1 was formed as in Table 2 below in the manner in which the anti-reflection film 11 is formed in the first variation of the first embodiment. The formation of each layer was performed in the same manner as in Invention Example 1.

TABLE 2

Invention Example 2-1 (Anti-reflection film 11)

| Layer No. | Material | Refractive index | Optical thickness |
|---|---|---|---|
| Air | — | — | — |
| 5 (Third layer 130) | SiO$_2$ | 1.49 | 0.25 × λ |
| 4 (Second layer 120) | HfO$_2$ | 2.08 | 0.25 × λ |
| 3 (Fifth layer 151) | Al$_2$O$_3$ | 1.71 | 0.50 × λ |
| 2 (Fourth layer 141) | HfO$_2$ | 2.08 | 0.50 × λ |
| 1 (First layer 110) | Al$_2$O$_3$ | 1.71 | 0.25 × λ |
| Window member | Synthetic quartz | 1.49 | — |
| Transmittance (Wavelength: 280 nm) | Normal incidence | 99.99% | |
| | 45° incidence | 98.57% | |

Invention Example 2-2

An anti-reflection film of Invention Example 2-2 was formed as in Table 3 below in the manner in which the anti-reflection film 12 is formed in the first variation of the first embodiment. Only the optical thickness of the fifth layer (topmost layer) was different from Invention Example 2-1. The formation of each layer was performed in the same manner as in Invention Example 1.

TABLE 3

Invention Example 2-2 (Anti-reflection film 11)

| Layer No. | Material | Refractive index | Optical thickness |
|---|---|---|---|
| Air | — | — | — |
| 5 (Third layer 130) | SiO$_2$ | 1.49 | 0.27 × λ |
| 4 (Second layer 120) | HfO$_2$ | 2.08 | 0.25 × λ |
| 3 (Fifth layer 151) | Al$_2$O$_3$ | 1.71 | 0.50 × λ |
| 2 (Fourth layer 141) | HfO$_2$ | 2.08 | 0.50 × λ |
| 1 (First layer 110) | Al$_2$O$_3$ | 1.71 | 0.25 × λ |
| Window member | Synthetic quartz | 1.49 | — |

TABLE 3-continued

Invention Example 2-2 (Anti-reflection film 11)

| Layer No. | Material | Refractive index | Optical thickness |
|---|---|---|---|
| Transmittance (Wavelength: 280 nm) | Normal incidence | 99.48% | |
| | 45° incidence | 99.58% | |

Invention Example 3-1

An anti-reflection film of Invention Example 3-1 was formed as in Table 4 below in the manner in which the anti-reflection film 12 is formed in the second variation of the first embodiment. The formation of each layer was performed in the same manner as in Invention Example 1.

TABLE 4

Invention Example 3-1 (Anti-reflection film 12)

| Layer No. | Material | Refractive index | Optical thickness |
|---|---|---|---|
| Air | — | — | — |
| 5 (Third layer 130) | SiO$_2$ | 1.49 | 0.25 × λ |
| 4 (Second layer 120) | HfO$_2$ | 2.08 | 0.25 × λ |
| 3 (First layer 110) | Al$_2$O$_3$ | 1.71 | 0.25 × λ |
| 2 (Fifth layer 152) | SiO$_2$ | 1.49 | 0.50 × λ |
| 1 (Fourth layer 142) | HfO$_2$ | 2.08 | 0.50 × λ |
| Window member | Synthetic quartz | 1.49 | — |
| Transmittance (Wavelength: 280 nm) | Normal incidence | 99.99% | |
| | 45° incidence | 98.23% | |

Invention Example 3-2

An anti-reflection film of Invention Example 3-2 was formed as in Table 5 below in the manner in which the anti-reflection film 12 is formed in the second variation of the first embodiment. Only the optical thickness of the fifth layer (topmost layer) was different from Invention Example 3-1. The formation of each layer was performed in the same manner as in Invention Example 1.

TABLE 5

Invention Example 3-2 (Anti-reflection film 12)

| Layer No. | Material | Refractive index | Optical thickness |
|---|---|---|---|
| Air | — | — | — |
| 5 (Third layer 130) | SiO$_2$ | 1.49 | 0.27 × λ |
| 4 (Second layer 120) | HfO$_2$ | 2.08 | 0.25 × λ |
| 3 (First layer 110) | Al$_2$O$_3$ | 1.71 | 0.25 × λ |
| 2 (Fifth layer 152) | SiO$_2$ | 1.49 | 0.50 × λ |
| 1 (Fourth layer 142) | HfO$_2$ | 2.08 | 0.50 × λ |
| Window member | Synthetic quartz | 1.49 | — |

TABLE 5-continued

Invention Example 3-2 (Anti-reflection film 12)

| Layer No. | Material | Refractive index | Optical thickness |
|---|---|---|---|
| Transmittance (Wavelength: 280 nm) | Normal incidence | 99.48% | |
| | 45° incidence | 99.91% | |

<Evaluation of Reflectance>

Figure 12A:
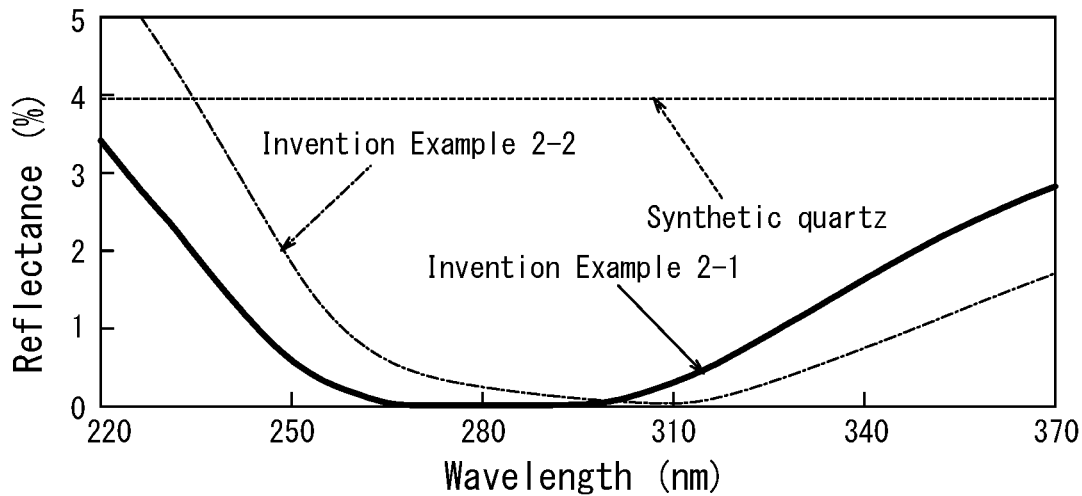
FIG. 12A is a graph illustrating the spectral reflectance in Invention Example 2-1 and Invention Example 2-2, and depicts the spectral reflectance for normal incidence.
Figure 12B:
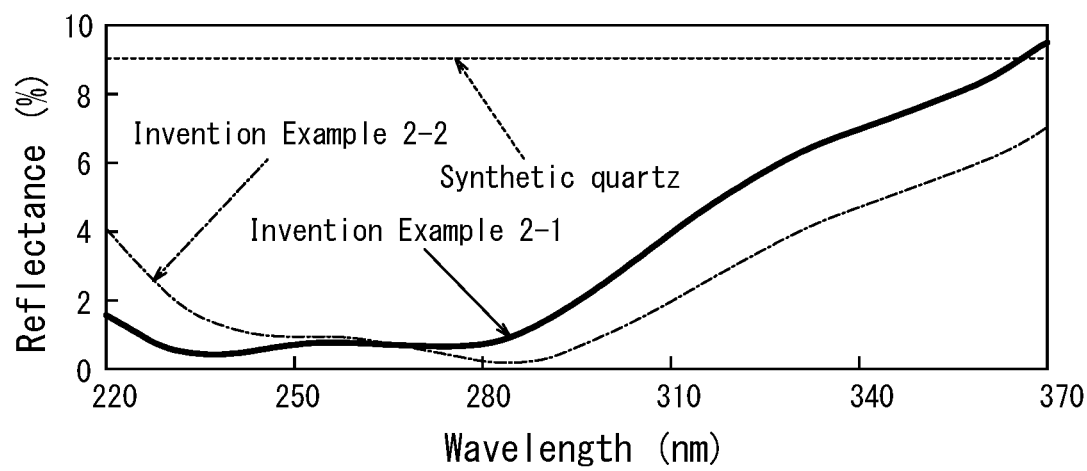
FIG. 12B is a graph illustrating the spectral reflectance in Invention Example 2-1 and Invention Example 2-2, and depicts the spectral reflectance for 45° oblique incidence.
Figure 13A:
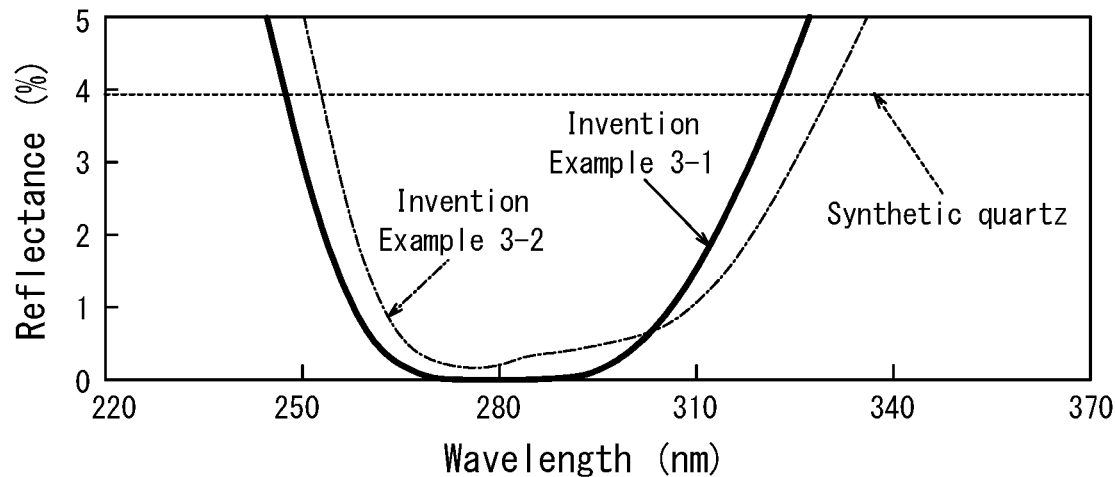
FIG. 13A is a graph illustrating the spectral reflectance in Invention Example 3-1 and Invention Example 3-2, and depicts the spectral reflectance for normal incidence.
Figure 13B:
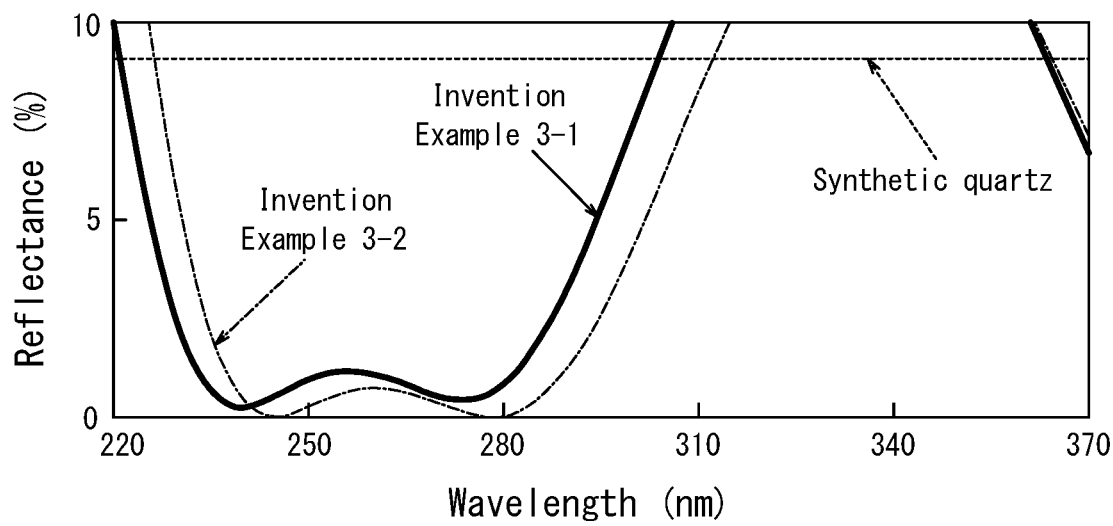
FIG. 13B is a graph illustrating the spectral reflectance in Invention Example 3-1 and Invention Example 3-2, and depicts the spectral reflectance for 45° oblique incidence.

The spectral reflectance of Invention Example 2-1 and Invention Example 2-2 are illustrated in the graphs of FIG. 12A and FIG. 12B. Similarly, the spectral reflectance of Invention Example 3-1 and Invention Example 3-2 are illustrated in the graphs of FIG. 13A and FIG. 13B. FIG. 12A and FIG. 13 illustrate the spectral reflectance in the case of normal incidence, and FIG. 12B and FIG. 13B illustrate the spectral reflectance in the case of 45° oblique incidence. When Invention Example 2-1 in which the optical thickness of only the topmost layer was changed was compared with Invention Example 2-2, although the peak position of the reflectance was shifted by approximately 20 nm to 30 nm, low reflectance was observed in both Invention Examples. Similarly, when Invention Example 3-1 in which the optical thickness of only the topmost layer was changed was compared with Invention Example 3-2, although the peak position of the reflectance was shifted by approximately 20 nm to 30 nm, low reflectance was observed in both Invention Examples.

Invention Example 4

An anti-reflection film of Invention Example 4 was formed as in Table 6 below in the manner in which the anti-reflection film 20 in the second embodiment is formed. The formation of each layer was performed in the same manner as in Invention Example 1.

TABLE 6

Invention Example 4 (Anti-reflection film 20)

| Layer No. | Material | Refractive index | Optical thickness |
|---|---|---|---|
| Air | — | — | — |
| 5 (Fifth layer 250) | SiO$_2$ | 1.49 | 0.25 × λ |
| 4 (Fourth layer 240) | HfO$_2$ | 2.08 | 0.25 × λ |
| 3 (Third layer 230) | SiO$_2$ | 1.49 | 0.25 × λ |
| 2 (Second layer 220) | Al$_2$O$_3$ | 1.71 | 0.25 × λ |
| 1 (First layer 210) | HfO$_2$ | 2.08 | 0.25 × λ |
| Window member | Synthetic quartz | 1.49 | — |
| Transmittance (Wavelength: 280 nm) | Normal incidence | 99.19% | |
| | 45° incidence | 99.37% | |

Invention Example 5

An anti-reflection film of Invention Example 5 was formed as in Table 7 below in the manner in which the anti-reflection film 30 in the third embodiment is formed. The formation of each layer was performed in the same manner as in Invention Example 1.

TABLE 7

Invention Example 5 (Anti-reflection film 30)

| Layer No. | Material | Refractive index | Optical thickness |
|---|---|---|---|
| Air | — | — | — |
| 5 (Fifth layer 350) | SiO$_2$ | 1.49 | 0.25 × λ |
| 4 (Fourth layer 340) | Al$_2$O$_3$ | 1.71 | 0.25 × λ |
| 3 (Third layer 330) | SiO$_2$ | 1.49 | 0.25 × λ |
| 2 (Second layer 320) | HfO$_2$ | 2.08 | 0.50 × λ |
| 1 (First layer 310) | Al$_2$O$_3$ | 1.71 | 0.50 × λ |
| Window member | synthetic quartz | 1.49 | — |
| Transmittance (Wavelength: 280 nm) | Normal incidence | 99.19% | |
| | 45° incidence | 98.58% | |

Invention Example 6

An anti-reflection film of Invention Example 6 was formed as in Table 8 below in the manner in which the anti-reflection film 40 in the fourth embodiment is formed. The formation of each layer was performed in the same manner as in Invention Example 1.

TABLE 8

Invention Example 6 (Anti-reflection film 40)

| Layer No. | Material | Refractive index | Optical thickness |
|---|---|---|---|
| Air | — | — | — |
| 4 (Fourth layer 440) | SiO$_2$ | 1.49 | 0.32 × λ |
| 3 (Third layer 430) | HfO$_2$ | 2.08 | 0.10 × λ |
| 2 (Second layer 420) | SiO$_2$ | 1.49 | 0.36 × λ |
| 1 (First layer 440) | HfO$_2$ | 2.08 | 0.50 × λ |
| Window member | Synthetic quartz | 1.49 | — |
| Transmittance (Wavelength: 280 nm) | Normal incidence | 99.99% | |
| | 45° incidence | 98.17% | |

<Evaluation of Moisture Resistance>

Deep ultraviolet light-emitting devices in which the anti-reflection films according to Invention Examples 1, 2-1, 2-2, 3-1, 3-2, 4, 5, and 6 were provided on both surface of the window members made of synthetic quartz were fabricated and were individually subjected to tests for evaluating moisture resistance under sets of assessment conditions 1 to 3 below.

[1] For a set of assessment condition 1, a moisture storage test was performed in which a sample was left in a moisturized environment of 85% RH at 85° C. for 1000 h.

[2] For a set of assessment conditions 2, a high temperature storage test was performed in which a sample was left in a high temperature environment of 20% or less RH at 85° C. for 1000 h.

[3] For a set of assessment conditions 3, a continuous energizing test was performed in which a sample was continuously energized in an ambient environment of room temperature and room humidity (temperature: 23° C. to 29° C., humidity: 25% RH to 35% RH) for 1000 h.

Under any of the sets of assessment conditions 1 to 3, the light output power after a lapse of 1000 h was comparable with the light output power at the start of the test. Thus, no change was observed in the transmittance of the anti-reflection films provided on the window member and all the anti-reflection films were found to have sufficient moisture resistance.

As described above, all the anti-reflection films according to Invention Examples 1, 2-1, 2-2, 3-1, 3-2, 4, 5, and 6 were found to be moisture resistant. Further, in each of Invention Examples above, the anti-reflection films were found to have a transmittance of 99% or more for normal incidence of deep ultraviolet light having a wavelength of 280 nm and even have a transmittance of 98% or more for 45° oblique incidence thereof.

Example 2

In Example 1, the material of the window member was synthetic quartz; on the other hand, in Example 2, the material of the window member was replaced with sapphire. When sapphire is not provided with an anti-reflection film, the transmittance for normal incidence of deep ultraviolet light having a wavelength of 280 nm upon sapphire is approximately 86.2% and the transmittance for 45° oblique incidence thereof is approximately 71.6%.

Invention Examples 11 to 16

In Invention Examples 1, 2-1, 2-2, 3-1, 3-2, 4, 5, and 6, the material of the window member was synthetic quartz (refractive index: 1.49); on the other hand, the anti-reflection films of Invention Examples 11, 12-1, 12-2, 13-1, 13-2, 14, 15, and 16 were formed in the same manner as in Invention Examples 1, 2-1, 2-2, 3-1, 3-2, 4, 5, and 6 except that the material of the window material was replaced with sapphire (refractive index: 1.71).

Figure 14A:
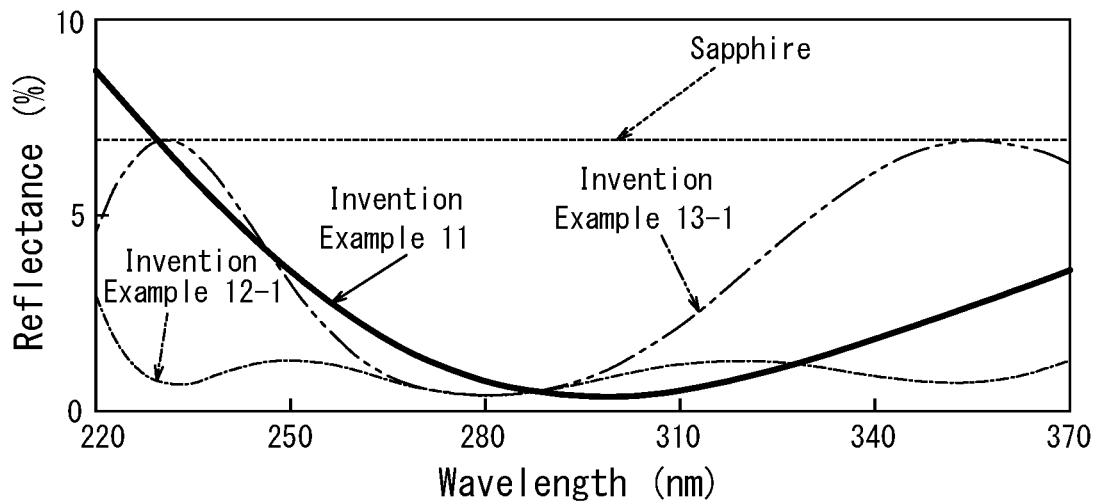
FIG. 14A is a graph illustrating the spectral reflectance in Invention Examples 11, 12-1, and 13-1, and depicts the spectral reflectance for normal incidence.
Figure 14B:
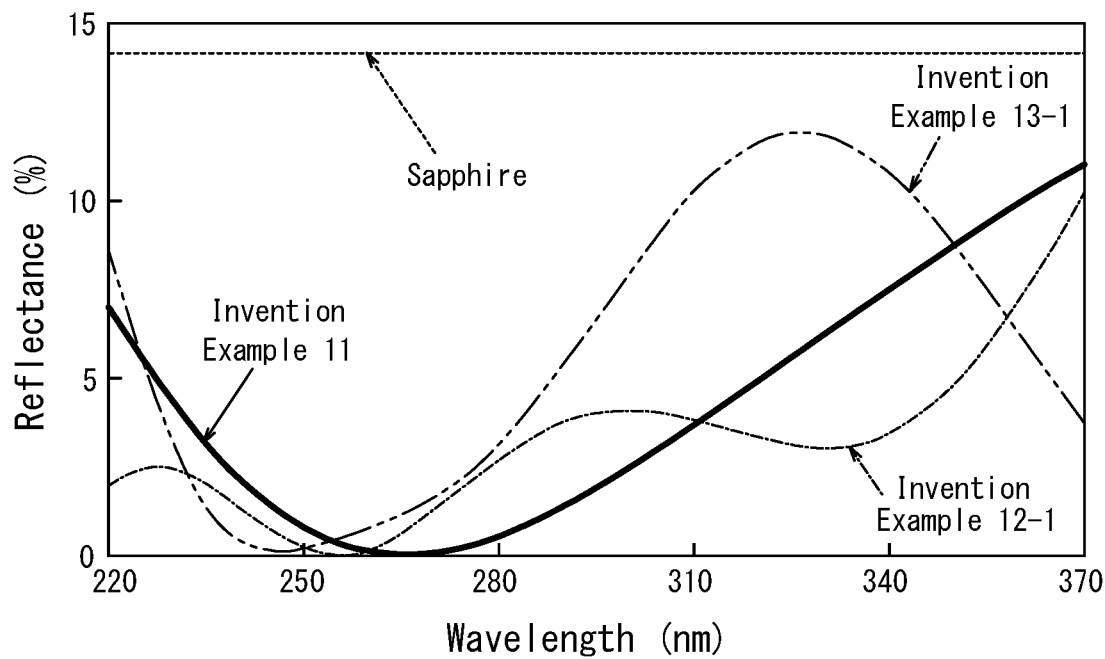
FIG. 14B is a graph illustrating the spectral reflectance in Invention Examples 11, 12-1, and 13-1, and depicts the spectral reflectance for 45° oblique incidence.

Anti-reflection films of Invention Examples 11, 12-1, 12-2, 13-1, 13-2, 14, 15, and 16 were subjected to measurements in the same manner as in Example 1. The transmittance (%) with respect to deep ultraviolet light having a wavelength of 280 nm, which was calculated from the reflectance is given in Table 9. Further, the spectral reflectance of the anti-reflection films according to Invention Example 11, 12-1, and 13-1 are illustrated as representative examples in the graphs of FIG. 14A and FIG. 14B. FIG. 14A illustrates the spectral reflectance in the case of normal incidence, and FIG. 14B illustrates the spectral reflectance in the case of 45° oblique incidence. Lower reflectance was observed for deep ultraviolet light having a center emission wavelength λ in a range of 260 nm or more and 340 nm or less, compared to when no anti-reflection film was provided. FIG. 14A and FIG. 14B also illustrate the reflectance of sapphire for reference.

TABLE 9

| | Transmittance (Wavelength: 280 nm) | | |
|---|---|---|---|
| | Normal incidence | 45° incidence | Corresponding embodiment |
| Invention Example 11 | 98.51% | 98.98% | Anti-reflection film 10 |
| Invention Example 12-1 | 99.21% | 94.57% | Anti-reflection film 11 |
| Invention Example 12-2 | 98.51% | 97.97% | Anti-reflection film 11 |
| Invention Example 13-1 | 99.21% | 93.84% | Anti-reflection film 12 |
| Invention Example 13-2 | 98.51% | 97.75% | Anti-reflection film 12 |
| Invention Example 14 | 99.99% | 99.37% | Anti-reflection film 20 |
| Invention Example 15 | 99.99% | 94.36% | Anti-reflection film 30 |
| Invention Example 16 | 99.22% | 95.48% | Anti-reflection film 40 |

The above results demonstrated that it is also advantageous to provide a window member made of sapphire with an anti-reflection film according to this disclosure. When the window member is made of sapphire, Invention Example 11 and Invention Example 14 in which the transmittance exceeded 98% both for normal incidence and 45° incidence are considered to be particularly preferred.

INDUSTRIAL APPLICABILITY

This disclosure provides a useful anti-reflection film which is highly moisture resistant and is suitable for use in a deep ultraviolet light-emitting device having low reflectance even for oblique incidence of deep ultraviolet light.

REFERENCE SIGNS LIST

1 Deep ultraviolet LED chip
10, 11, 12, 20, 30, 40 Anti-reflection film
110, 210, 310 First layer
120, 220, 320 Second layer
130, 230, 330 Third layer
141, 142, 240, 340, 440 Fourth layer
151, 152, 250, 350, 450 Fifth layer
C Carrier
E1, E2 Electrode
L Deep ultraviolet light
R1, R2 Reflected light
W Window member

The invention claimed is:
1. An anti-reflection film which is provided on a light-transmitting window member, and prevents reflection of deep ultraviolet light having a center emission wavelength λ in a range of 260 nm or more and 340 nm or less, consisting of:
    a first layer having a first refractive index, provided on the window member;
    a second layer having a second refractive index, provided on the first layer; and
    a third layer having a third refractive index, provided on the second layer,
    wherein for light having a wavelength of 280 nm,
    the first refractive index is 1.6 or more and 2.0 or less,
    the second refractive index is 2.0 or more and 2.7 or less and is higher than the first refractive index, the third refractive index is 1.3 or more and 1.6 or less and is lower than the first refractive index, and materials of the layers having the first refractive index, the second refractive index, and the third refractive index are made of oxides different from each other.

2. The anti-reflection film according to claim 1, wherein an optical thickness $nd_1$ of the first layer, an optical thickness $nd_2$ of the second layer, and an optical thickness $nd_3$ of the third layer satisfy, with respect to the center emission wavelength λ:

$0.24\lambda \le nd_1 \le 0.26\lambda$, $0.24\lambda \le nd_2 \le 0.26\lambda$, and $0.26\lambda \le nd_3 \le 0.28\lambda$.

3. The anti-reflection film according to claim 2, wherein a material of the layer having the first refractive index is $Al_2O_3$, a material of the layers having the second refractive index is $HfO_2$, a material of the layer having the third refractive index is $SiO_2$.

4. The anti-reflection film according to claim 1, wherein a material of the layer having the first refractive index is $Al_2O_3$, a material of the layers having the second refractive index is $HfO_2$, a material of the layer having the third refractive index is $SiO_2$.

5. A deep ultraviolet light-emitting device comprising:
a deep ultraviolet LED chip emitting light having a center emission wavelength λ in a range of 260 nm or more and 340 nm or less; and
a window member provided on a light extraction side of the deep ultraviolet LED chip,
wherein the anti-reflection film according to claim 1 is provided at least on a side of the window member, opposite to the deep ultraviolet LED chip.

6. An anti-reflection film which is provided on a light-transmitting window member, and prevents reflection of deep ultraviolet light having a center emission wavelength λ in a range of 260 nm or more and 340 nm or less, comprising:
a first layer having a first refractive index, provided on the window member;
a second layer having a second refractive index, provided on the first layer;
a third layer having a third refractive index, provided on the second layer,
wherein for light having a wavelength of 280 nm,
the first refractive index is 1.6 or more and 2.0 or less,
the second refractive index is 2.0 or more and 2.7 or less and is higher than the first refractive index,
the third refractive index is 1.3 or more and 1.6 or less and is lower than the first refractive index, and
materials of the layers having the first refractive index, the second refractive index, and the third refractive index are made of oxides different from each other, and
the anti-reflection film further comprising:
a fourth layer having the second refractive index of 2.0 or more and 2.7 or less; and
a fifth layer having the third refractive index of 1.3 or more and 1.6 or less on the fourth layer,
wherein the fourth layer and the fifth layer are provided between the window member and the first layer.

7. The anti-reflection film according to claim 6, wherein an optical thickness $nd_1$ of the first layer, an optical thickness $nd_2$ of the second layer, an optical thickness $nd_3$ of the third layer, an optical thickness $nd_4$ of the fourth layer, and an optical thickness $nd_5$ of the fifth layer satisfy, with respect to the center emission wavelength λ:

$0.24\lambda \le nd_1 \le 0.26\lambda$, $0.24\lambda \le nd_2 \le 0.26\lambda$, $0.24\lambda \le nd_3 \le 0.28\lambda$, $0.48\lambda \le nd_4 \le 0.52\lambda$, and $0.48\lambda \le nd_5 \le 0.52\lambda$.

8. The anti-reflection film according to claim 7, wherein a material of the layer having the first refractive index is $Al_2O_3$, a material of the layers having the second refractive index is $HfO_2$, a material of the layer having the third refractive index is $SiO_2$.

9. The anti-reflection film according to claim 6, wherein a material of the layer having the first refractive index is $Al_2O_3$, a material of the layers having the second refractive index is $HfO_2$, a material of the layer having the third refractive index is $SiO_2$.

10. A deep ultraviolet light-emitting device comprising:
a deep ultraviolet LED chip emitting light having a center emission wavelength λ in a range of 260 nm or more and 340 nm or less; and
a window member provided on a light extraction side of the deep ultraviolet LED chip,
wherein the anti-reflection film according to claim 6 is provided at least on a side of the window member, opposite to the deep ultraviolet LED chip.

11. An anti-reflection film which is provided on a light-transmitting window member, and prevents reflection of deep ultraviolet light having a center emission wavelength λ in a range of 260 nm or more and 340 nm or less, comprising:
a first layer having a second refractive index, provided on the window member;
a second layer having a first refractive index, provided on the first layer;
a third layer having a third refractive index, provided on the second layer;
a fourth layer having the second refractive index, provided on the third layer; and
a fifth layer having the third refractive index, provided on the fourth layer,
wherein for light having a wavelength of 280 nm,
the first refractive index is 1.6 or more and 2.0 or less,
the second refractive index is 2.0 or more and 2.7 or less and is higher than the first refractive index,
the third refractive index is 1.3 or more and 1.6 or less and is lower than the first refractive index, and
the materials of the layers having the first refractive index, the second refractive index, and the third refractive index are made of oxides different from each other.

12. The anti-reflection film according to claim 11, wherein an optical thickness $nd_1$ of the first layer, an optical thickness $nd_2$ of the second layer, an optical thickness $nd_3$ of the third layer, an optical thickness $nd_4$ of the fourth layer, and an optical thickness $nd_5$ of the fifth layer satisfy, with respect to the center emission wavelength λ:

$0.24\lambda \le nd_1 \le 0.26\lambda$, $0.24\lambda \le nd_2 \le 0.26\lambda$, $0.24\lambda \le nd_3 \le 0.26\lambda$, $0.24\lambda \leq nd_4 \leq 0.26\lambda$, and $0.24\lambda \leq nd_5 \leq 0.26\lambda$.

13. The anti-reflection film according to claim 12, wherein a material of the layer having the first refractive index is $Al_2O_3$, a material of the layers having the second refractive index is $HfO_2$, a material of the layers having the third refractive index is $SiO_2$.

14. The anti-reflection film according to claim 11, wherein a material of the layer having the first refractive index is $Al_2O_3$, a material of the layers having the second refractive index is $HfO_2$, a material of the layers having the third refractive index is $SiO_2$.

15. A deep ultraviolet light-emitting device comprising:
a deep ultraviolet LED chip emitting light having a center emission wavelength λ in a range of 260 nm or more and 340 nm or less; and
a window member provided on a light extraction side of the deep ultraviolet LED chip,
wherein the anti-reflection film according to claim 11 is provided at least on a side of the window member, opposite to the deep ultraviolet LED chip.

* * * * *